(12) United States Patent
Briaire

(10) Patent No.: US 7,345,609 B2
(45) Date of Patent: Mar. 18, 2008

(54) CURRENT STEERING D/A CONVERTER WITH REDUCED DYNAMIC NON-LINEARITIES

(75) Inventor: Joseph Briaire, Eindhoven (NL)

(73) Assignee: NXP B.V., Eindhoven (NL)

( * ) Notice: Subject to any disclaimer, the term of this patent is extended or adjusted under 35 U.S.C. 154(b) by 63 days.

(21) Appl. No.: 10/562,292

(22) PCT Filed: Jun. 24, 2004

(86) PCT No.: PCT/IB2004/050997

§ 371 (c)(1),
(2), (4) Date: Dec. 27, 2005

(87) PCT Pub. No.: WO2005/002058

PCT Pub. Date: Jan. 6, 2005

(65) Prior Publication Data

US 2007/0096969 A1    May 3, 2007

(30) Foreign Application Priority Data

Jun. 27, 2003   (EP)   ................................. 03101932

(51) Int. Cl.
*H03M 1/66* (2006.01)
(52) U.S. Cl. ........................ 341/144; 341/118; 341/136
(58) Field of Classification Search ................. 341/144
See application file for complete search history.

(56) References Cited

U.S. PATENT DOCUMENTS

| | | | |
|---|---|---|---|
| 4,663,610 A * | 5/1987 | Metz et al. ................. | 341/133 |
| 4,791,406 A * | 12/1988 | Mehrgardt et al. .......... | 341/144 |
| 5,036,322 A * | 7/1991 | Barrow et al. .............. | 341/144 |
| 5,164,725 A * | 11/1992 | Long .......................... | 341/118 |
| 5,745,064 A * | 4/1998 | Ohya ......................... | 341/144 |
| 5,933,107 A * | 8/1999 | Tan ............................ | 341/144 |
| 6,104,330 A | 8/2000 | Redman-White et al. | |
| 6,329,940 B1 * | 12/2001 | Dedic ........................ | 341/144 |
| 6,344,816 B1 | 2/2002 | Dedic | |
| 6,452,527 B2 * | 9/2002 | Takeya et al. .............. | 341/144 |
| 6,456,218 B1 * | 9/2002 | Dedic et al. ................ | 341/144 |
| 6,496,129 B2 * | 12/2002 | Dedic et al. ................ | 341/144 |
| 6,794,924 B2 * | 9/2004 | Curry et al. ................ | 327/408 |
| 6,906,652 B2 * | 6/2005 | Bugeja ...................... | 341/145 |
| 7,034,733 B2 * | 4/2006 | Dedic et al. ................ | 341/150 |

* cited by examiner

*Primary Examiner*—Khai M. Nguyen
(74) *Attorney, Agent, or Firm*—Peter Zawilski

(57) ABSTRACT

A digital to analog converter including a first current source (3) to which a first digital signal (28,31) is applied for conversion to an analog signal, wherein the first digital signal has a predetermined clock cycle. The digital to analog converter further comprising a second dummy current source (30) associated with the first current source to which a second digital signal (29,32) is applied. The second digital signal is derived from the first digital signal so that in any one clock cycle either the first or the second current source switches. This arrangement has the advantage that the dynamic behavior of the converter is not signal dependent, but dependent only on the clock cycle.

20 Claims, 2 Drawing Sheets

CURRENT STEERING D/A CONVERTER WITH REDUCED DYNAMIC NON-LINEARITIES

This application is a 371 of PCT/IB04/50997 filed Jun. 24, 2004, which claims priority to EPO application 03101932.6 filed on Jun. 27, 2003.

The invention relates to a digital to analog converter and a method of converting a digital signal to an analog signal A digital to analog converter converts digital signals to analog signals. Conventional digital to analog converters, for example as described in US-A-6,104,330, comprise a plurality of current sources connected to common power and bias lines. The sources are also connected to an output via a plurality of respective switches. The signal to be converted is applied to the switch. The analog output is constructed from a selectable number of the current sources in accordance with the digital signal received at each of the plurality of switches.

A problem with such conventional digital to analog converters is achieving linearity. One type of error that contributes to non-linearity in digital to analog converters is that when a current source is switched on or off disturbances arise in the device. For example, in a conventional device having a selectable plurality of current sources, to increase the output signal (current), an additional number of sources must be switched on. However, because the sources are connected to common power and bias lines, they are not fully independent of one another. Thus, switching of one current source will influence the common lines, and thus the other sources connected to the common lines.

It has been found that this problem is proportional to the number of sources that need to be switched. For example, two switching sources will lead to a double disturbance compared to one switching source. This effect leads to internal dynamic non-linearities.

A further problem with conventional digital to analog converters is that the timing of the switching of sources is influenced. For example, the switching of a source requires a certain amount of power at the moment of switching. If two sources are to switch at a particular moment, twice the power to switch is needed. However, in any system the amount of instantaneous power that is available is limited. Thus, the switching process becomes slower when more source switching operations are required. The switching delay of the output is proportional to the output change. Due to this delay the output is distorted. This data dependent delay leads to dynamic non-linearities in the output signal. The delay is independent of the sign of the data change, i.e. is independent of whether the digital signal goes from high to low or low to high. This sign independence is a common effect in differential circuits such as the current source circuits of conventional digital to analog converters.

At the higher data frequency operation required by contemporary digital to analog converters, not only do the problems mentioned above get worse, but the additional problem of capacitive cross coupling between the current sources and switches causes increased interference at such higher data frequencies.

Dampening techniques have been proposed to attempt to decrease the effect of such data dependent disturbances on the functioning of the device. However, as data rates increase, known damping techniques no longer provide adequate results.

To address the unrelated problem of providing a constant output capacitance, U.S. Pat. No. 6,104,330 provides "dummy" current sources which are switched in accordance with the logical complement of the digital signal to be converted. However, this device suffers the drawbacks of other conventional devices with respect to switching related dynamic non-linearities. In a further prior art digital to analog converter, as described in U.S. Pat. No. 6,344,816, it is proposed to duplicate part of the switching circuit. However, in U.S. Pat. No. 6,344,816 the dummy sources are not disclosed as being connected to the line providing power to the main current sources. Thus, it is unclear to what, if any, extent this device suffers from the problem of dynamic non-linearities due to switching of the main current sources on common lines. Although, it can be seen that U.S. Pat. No. 6,344,816 attempts to maintain a constant load on the common lines, it does not address the problem that the switching of current sources introduces signal dependent non-linearities.

The present invention provides a solution to the problems identified above with respect to conventional digital to analog converters.

According to a first aspect of the invention, there is provided a digital to analog converter comprising a first current source connected to a plurality of common lines and to a first node, wherein said first node forms an output of the digital to analog converter via a respective switch whose state is controlled in accordance with a first applied digital signal to be converted, the digital to analog converter further comprising a second current source which is associated with said first current source, wherein said second current source is connected to at least one of said common lines and to a second node via a respective second switch whose state is controlled in accordance with a second applied digital signal, characterized in that second applied digital signal causes said second respective switch to change state such that influences on at least said one of said common lines caused by said first and second switches switching are periodic.

The present invention provides an advantage that the internal dynamics of the device are not signal dependent. In particular, no disturbances caused by local effects, such as the switching of a source caused by a signal, cause global signal dependent disturbances on a common line.

According to a second aspect of the invention, there is provided a method of converting a digital signal to an analog signal method of converting a digital signal to an analog signal comprising the steps of:

providing a first current source, connecting said first current source to a plurality of common lines and to a first node, wherein said first node forms an output of the digital to analog converter via a respective switch whose state is controlled in accordance with a first applied digital signal to be converted, further providing a second current source which is associated with said first current source, connecting said second current source to at least one of said common lines and to a second node via a respective second current switch whose state is controlled in accordance with a second applied digital signal, characterized by applying said second digital signal to said second respective switch causing said second respective switch to change state such that influences on at least said one of said common lines caused by said first and second switches switching is time averaged.

In order that the invention may be more fully understood embodiments thereof with now be described by way of example only, with reference to the FIGS. in which.

Figure 1:
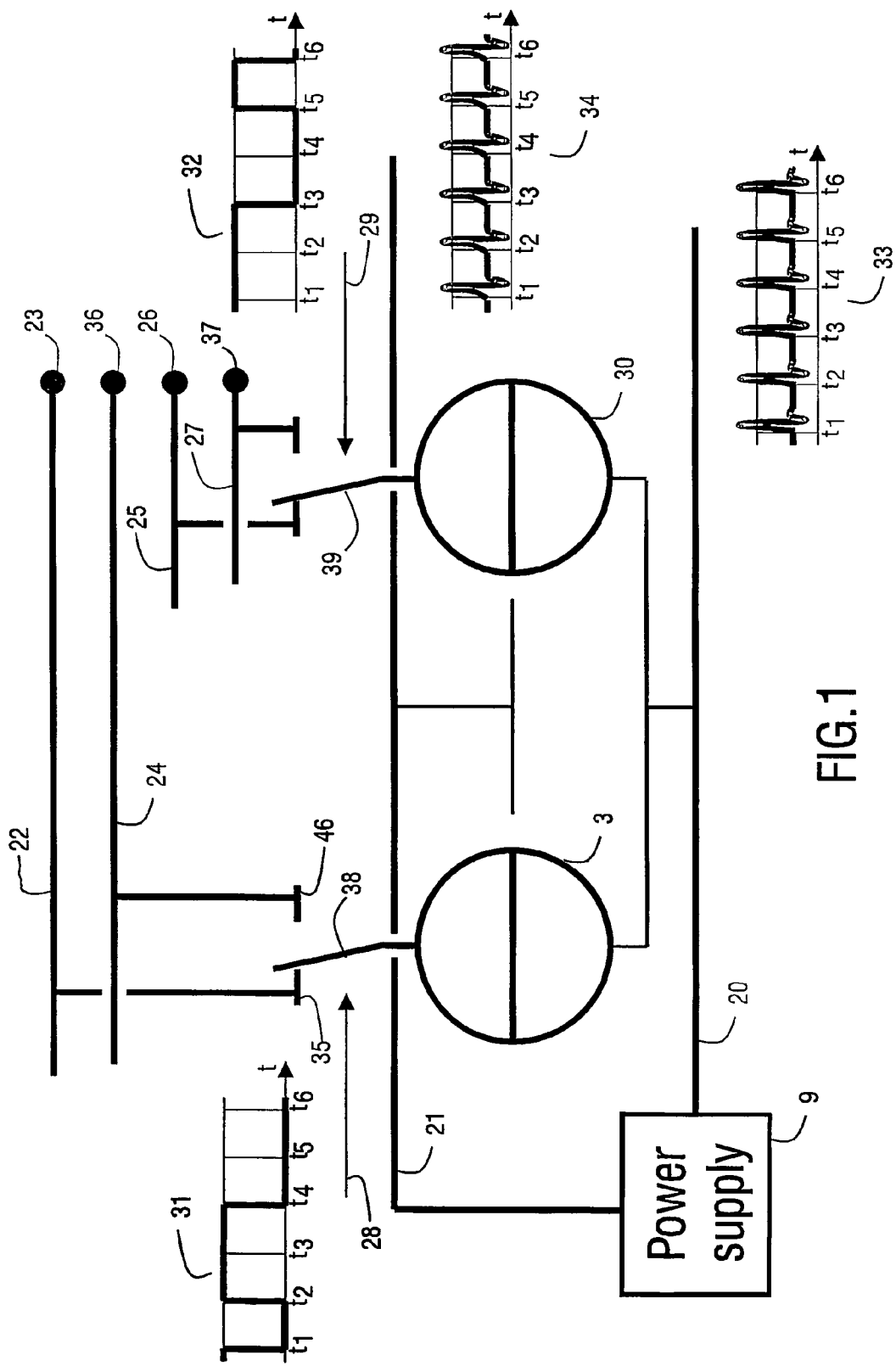
FIG. 1 shows a circuit diagram of a digital to analog converter according to a first embodiment of the present invention.

FIG. 1 shows details of a digital to analog converter according to a first embodiment of the present invention. In particular, the digital to analog converter comprises a first current source 3 and a second current source 30. The second current source 30 may also be referred to as a "shadow" or "dummy" source, and is described in more detail hereinbelow. The first current source is connected to a common power line 20, which supplies power to the current source and a common bias line 21, which biases the current source. A power supply 9 is provided to provide preferably the first and second current source 3, 30 with power. Preferably, a single power supply 9 is provided. The second current source 30 in the embodiment shown is also connected to both common lines 20, 21. In an alternative embodiment, the second current source 30 is connected to only one or other of the common lines.

A first digital signal 31 is generated in dependence on the signal to be converted, as discussed with reference to FIG. 1 below. In response to the first digital signal 31, which is carried on first input data line 28, the first current source 3 is caused to be switched between two positions by switch 35, 46, 38. The first digital signal comprises a single bit data which governs the position of the switch 38 of the first current source. The data making up the first digital signal is generated in dependence on a clock having a predetermined clock cycle.

In a first position 35, the output of the current source is high, and in the second position 46, the output of the current source is low. The high output caused by the switch being in the first position is output to output line 22 having output 23. The low output caused by the switch being in the second position is output to output line 24. The low output line 24 provides output at output node 36. Output 23 and output 36, to which the high and low outputs are fed, respectively, forms the output node of the digital to analog converter, and is discussed in more detail with reference to FIG. 2. The switch 35, 46, 38 is arranged so that when the first digital signal 31 is input to the switch 35, 46, 38, the switch will switch in accordance with the signal. For example, first digital signal 31 at time, t1, will cause the switch to switch the output of the current source 3 from a high output 35 to a low output 46. At time, t2, the switch will switch the output of the current source from the low output 46 to the high output 35. At time, t3, no switching occurs. At time, t4, the switch will cause the output of the current source to be switched from a high output 35 to a low output 46. At times, t5 and t6, no switching occurs. As mentioned, in conventional digital to analog converters, the switching action causes disturbances to arise on the common lines 20, 21.

To overcome this problem the second current source 30 and respective switch 39 are provided. A second digital input code 32 is fed to the second current source 30 via second input line 29. The second digital input code comprises single bit data and is derived from the first digital input code. Preferably, the second current source 30 is disposed adjacent to the first current source 3. Preferably, the second current source 30 is identical to said first current source 3, preferably including the output load. With respect to the output load, it is commented that in a system, components, such as a cable line, an antenna, etc. will be connected to the output nodes 23, 36. Further, downstream of the output nodes 23, 36, a further component will register the output signal. These components put a load on the digital to analog converter, and are referred to as the "output load". Sometimes the output load is heavy, which means that it absorbs a lot of power. If this is die case, the convener will need to supply a lot of power on a single output line, if the output signal, in the present invention, the output current is high, and less if the output signal is low. The effect of this is that the digital to analog converter will experience a signal dependent "kick back", which depends on the output load. It will be understood that while the above description of the output load influence is essentially a static one, it may become even more of a problem dynamically, that is when a current source switches. It has been found that the response of the switching on the global lines is also partly a result of the response due to the output load. So, preferably, if the response of the shadow switching on the global lines is to be equal to that of the switching of the first current sources, the output loads of both output lines are preferably matched. Thus, preferably, the output loads associated with first and second nodes 23, 36, 26, 37 are substantially matched.

The second digital code 29 is derived so that for each clock cycle either the first current source or the second (or shadow) current source will be caused to switch. The polarity of the switching is not important, i.e. it is not important whether the first or second current source switches from high to low or vice versa. The switching of the first current source depends on the signal to be converted, that is the first digital data code. The second current source is caused to switch at all clock cycles at which the first current source is supposed not to switch. As a result, the combined first and second current sources will switch once during each clock cycle. Consequently, the contribution of the combined first and second current sources to the global dynamics that influence all current sources in the digital to analog converter, is not dependent on the signal to be converted (which determines the first data signal), but only on the clock. It will be understood that clock dependence in a digital to analog converter is trivial since the clock signal is the reference signal for the dynamics in a digital to analog converter.

The results of the present invention are shown by plots 33 and 34, which show the influence of switching on the power and bias lines respectively with respect to time, t. As mentioned previously, the response to a switching event is independent of the sign of the switching, i.e. whether the switching is from zero to one or one to zero. As a result, time t1 and t2 produce the same response on the common lines. It is seen that according to the present invention, the influence of the switching of the first and second current sources is periodic. Thus, over time, the influence of switching on the common lines 20, 21 occur at substantially regular intervals.

Preferably, output lines 22 and 24 from the first current source 3 are provided with respect to the first position 35 and the second switch position 46, respectively, wherein the output node 23 is provided on output line 22 to which the high outputs are switched. The output line 24 which directs the output from the second (low) position 46 is used, as discussed hereinbelow, to construct the analog signal. Similarly, the second current source is provided with output lines 25, 27 which lead to a second output node 26, 37, where output line 25 is directed to node portion 26 and output line 27 is directed to node portion 37. Output line 25 is provided with respect to the first and second switch positions of the second current source switch, respectively. It will be understood, that in principle, if the influence of the output load is negligible, the output node 26 of the output line 25 to which the high outputs of the second current source 30 are directed, may be discarded, because these components are not necessary to construct the analog signal. It is commented that it is not necessary to provide an external load at nodes 26 and 37. However, some form of internal load or short circuit is necessary if there is no external node.

Preferably, to avoid signal dependent coupling to the global (otherwise referred to as common) bias lines and also the substrate via the differential output lines 22, 24, 25, 27, the differential output lines 22, 24, 25, 27 are run substantially parallel to each other due to the first and the second current sources 3, 30. Similarly, the input lines 28, 29 for the first and second current sources are preferably differential and run in parallel. This may be achieved, by disposing the first and second current sources 3, 30 adjacent to each another.

It has been found that the principle of the present invention discussed above may also be extended to the digital domain of a digital to analog converter because the digital dynamics also influence the analog operation. Hence, it has been found that each digital operation is preferably carried out differently, preferably based on current control and accompanied by a second current source, which performs the shadow operation. With respect to current control, i.e. one bit switching using a current source and a switch that switches the current to one line or the other as used in the present invention, it is mentioned that one advantage of digital current control is speed, which makes current control of particular application in fast and small circuits. A further advantage of the present use of current control is that it uses an almost constant amount of power, and that it is inherently differential (as current is switched to one or another line), thus, a zero to one or a one to zero transition produces the same effect on the common lines, as mentioned above.

Figure 2:
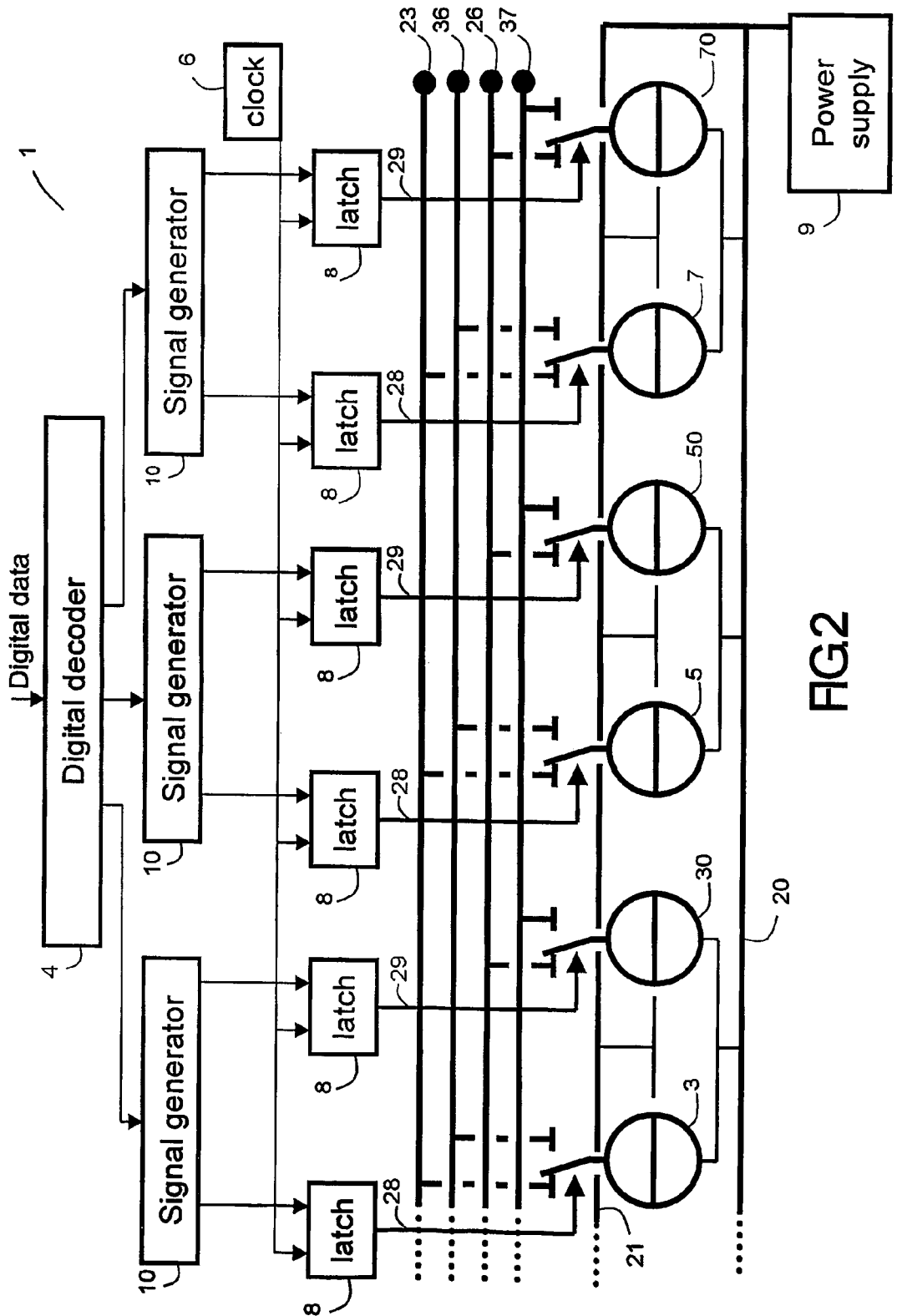
FIG. 2 shows further details of a circuit diagram of a digital to analog converter according to an alternative embodiment of the present invention.

FIG. 2 shows further details of a circuit diagram of a digital to analog converter according to an alternative embodiment of the present invention. These elements in FIG. 2 having the same reference numerals as those shown in FIG. 1, are not described again with reference specifically to FIG. 2, unless aspects thereof are expanded upon.

It will be understood that digital to analog converters typically comprise a plurality of first current sources. As mentioned previously, the problem addressed by the present invention becomes worse the greater the number of current sources comprised in the converter. In general and by way of example, without reference to FIG. 2, which shows only three first current sources, a three bit digital to analog converter is constructed to convert digital data from 000 to 111. To convert three bit digital data to an analog signal seven current sources are required (i.e. to convert an N bit digital signal $2^N-1$ first current sources 20 are required). For the sake of simplicity, FIG. 2 shows only three first current sources 3, 5, 7. In practice, it will be understood that the digital to analog converter is constructed to convert data having a larger number of bits than three. This is realized by providing an appropriate number of sources and latches and appropriate circuitry. The invention is not limited in respect of the number of bits the data for conversion comprises. The analog output is ascertained differently, that is the analog output is dependent on the difference between outputs 23 and 36. However, the invention is not limited in this respect. The output signal may also be carried on a single output line. It is not essential that the output is differential.

In FIG. 2, the digital to analog converter 1 comprises a digital decoder 4, a plurality of latches 8, which are responsive to a clock signal generated by clock 6, and a 30 plurality of first current sources 3, 5, 7 and a plurality of second current sources 30, 50, 70. First and second current sources 3, 5, 7, 30, 50, 70 are responsive to a latch signal generated by the latches 8. The first current sources provide an analog signal which is directed, depending on the latch signal on to a first output line 22 or a second output line 24 to outputs 23 and 36, respectively, depending on the latch signal.

On the basis of the digital data received by the digital decoder 4, the digital decoder derives the first digital signal 31, which is directed via latch 8 to the first current sources 3, 5, 7. The first digital signal is also directed to a signal generator 10, which is arranged to derive and generate a second digital signal 32, from the first digital signal 31. The signal generator 10 identifies those clock cycles in the first digital signal 31 that are part of the digital input which is to be converted, in which no switching occurs, and on the basis of this analysis generates the second digital signal which comprises signal components, which cause switching in those clock cycles in which no switching is identified in the first digital signal 31. It is noted that in the embodiment shown in FIG. 2, each pair of sources is provided with a signal generator 10. However, the present invention is not limited in this respect and with appropriate circuitry, a single signal generator may also be provided. It is not necessary that each pair of sources is provided with a signal generator. The signal generator 10 subsequently directs the second digital signal 32 via latches 8 to the second current source 30, 50, 70 associated with each respective first current source 3, 5, 7. It will be understood that each first current source has an associated second current source. For example, second current source 30 is associated with first current source 3. Thus, from the first digital signal 31 to be applied to first current source 3, a second digital signal 32 is derived and specifically applied to the appropriate associated second current source. The analog output is the difference between outputs 23 and 36. Preferably, the first and second digital signals are applied substantially synchronously to the first and second switches respectively.

While specific embodiments of the invention have been described above, it will be appreciated that the invention may be practiced otherwise than as described. The description is not intended to limit the invention.

The invention claimed is:

1. A digital to analog converter comprising a first current source connected to a plurality of common lines and to a first node, wherein said first node forms an output of the digital to analog converter via a first switch whose state is controlled in accordance with a first applied digital signal to be converted, the first applied digital signal occurring at substantially irregular intervals, the digital to analog converter further comprising a second current source which is associated with said first current source, wherein said second current source is connected to at least one of said common lines and to a second node via a second switch whose state is controlled in accordance with a second applied digital signal, characterized in that the second applied digital signal causes said second switch to change state such that influences on the at least one of said common lines caused by said first and second switches switching occur at substantially regular intervals.

2. A digital to analog converter according to claim 1, wherein said first signal has a plurality of signal components each having a duration substantially equal to one or more clock cycles, and wherein said second signal is derived from said first signal so that, during data conversion, during each clock cycle one and only one of the first and second switches is caused to switch.

3. A digital to analog converter according to claim 1, further comprising a power supply to which said first current source and said second current source are connected.

4. A digital to analog converter according to claim 1, wherein said first current source is disposed adjacent to said second associated current source.

5. A digital to analog converter according to claim 1, wherein said first and second digital signals are carried on first and second digital input lines, respectively, wherein said first digital input line is connected to said first switch and said second digital input line is connected to said second switch, wherein said first and second digital input lines are arranged in parallel.

6. A digital to analog converter according to claim 1, wherein said second digital signal is generated by a signal generating means comprising a circuit for identifying clock cycles in said first digital signal in which, when applied to said first switch, a signal component causes said first current source to switch, and for generating in response to the identification, a second digital signal including a signal component which, when applied to said second switch, causes said second current source to switch, in those clock cycles in which no such component is identified in said first digital signal, so that, during data conversion, in each clock cycle, one of the first and second switches is caused to switch.

7. A digital to analog converter according to claim 1, wherein output loads associated with the first and second nodes are substantially matched.

8. A digital to analog converter according to claim 7 wherein said output loads are components that register an output signal and put a load on the output nodes of the digital to analog converter.

9. A digital to analog converter according to claim 7 wherein said output loads are a cable line.

10. A digital to analog converter according to claim 7 wherein said output loads are an antenna.

11. A digital to analog converter according to claim 1, further comprising a plurality of first current sources, each of which is associated with one of a plurality of second current sources, wherein each of said plurality of first and second current sources is provided with a respective switch.

12. A digital to analog converter according to claim 1 wherein said second current source is identical to said first current source.

13. A method of converting a digital signal to an analog signal comprising the steps of:
providing a first current source,
connecting said first current source to a plurality of common lines and to a first node, wherein said first node forms an output of the digital to analog converter via a first switches whose state is controlled in accordance with a first applied digital signal to be converted, the first applied digital signal occurring at substantially irregular intervals,
further providing a second current source which is associated with said first current source, connecting said second current source to at least one of said common lines and to a second node via a second switch whose state is controlled in accordance with a second applied digital signal characterized by applying said second digital signal to said second switch causing said second switch to change state such that influences on the at least one of said common lines caused by said first and second switches switching occur at substantially regular intervals.

14. A digital to analog converter comprising:
a first current source connected to a plurality of common lines and to a first node, the first node forming an output of the digital to analog converter via a first switch whose state is controlled in accordance with a first applied digital signal to be converted, the first applied digital signal having a plurality of signal components each having a duration substantially equal to one or more clock cycles; and
a second current source that is associated with the first current source, the second current source connected to at least one of the common lines and to a second node via a second switch whose state is controlled in accordance with a second applied digital signal, the second applied digital signal derived from the first applied digital signal such that, during data conversion, during any one clock cycle either the first current source or the associated second current source is caused to switch;
characterized in that the second applied digital signal causes the second switch to change state such that influences on the at least one common line caused by the first and second switches switching are periodic.

15. A digital to analog converter according to claim 14, further comprising a power supply to which said first current source and said second current source are connected.

16. A digital to analog converter according to claim 14, wherein said first current source is disposed adjacent to said second associated current source.

17. A digital to analog converter according to claim 14, wherein said first and second digital signals are carried on first and second digital input lines, respectively, the first and second digital input lines arranged in parallel, and wherein said first digital input line is connected to said first switch and said second digital input line is connected to said second switch.

18. A digital to analog converter according to claim 14, wherein said second digital signal is generated by signal generating means comprising a circuit for identifying clock cycles in said first digital signal in which, when applied to said first switch, a signal component causes said first current source to switch, and for generating in response to the identification, the second digital signal including a signal component which, when applied to said second switch, causes said second current source to switch, in those clock cycles in which no such component is identified in said first digital signal, so that, during data conversion, in any one clock cycle, either said first or said second current source is caused to switch.

19. A digital to analog converter according to claim 14, wherein output loads associated with the first and second nodes are substantially matched.

20. A digital to analog converter according to claim 14, further comprising a plurality of first current sources, each of which is associated with one of a plurality of second current sources, wherein each of the plurality of first and the plurality of second current sources is provided with a respective switch.

* * * * *